United States Patent [19]

Posseme

[11] Patent Number: 4,808,923
[45] Date of Patent: Feb. 28, 1989

[54] SYSTEM FOR CALCULATING THE PATH OF A NAVAL VESSEL

[75] Inventor: Gilles Posseme, Brest, France

[73] Assignee: Thomson CSF, Paris, France

[21] Appl. No.: 946,632

[22] Filed: Dec. 24, 1986

Related U.S. Application Data

[63] Continuation of Ser. No. 631,750, Jul. 17, 1984, abandoned.

[30] Foreign Application Priority Data

Aug. 4, 1983 [FR] France .................. 83 12899

[51] Int. Cl.$^4$ .............................................. G01B 7/14
[52] U.S. Cl. .................................................... 324/207
[58] Field of Search ............... 324/207, 208, 228, 234, 324/235, 236, 244, 246, 247, 249, 250–262; 455/304

[56] References Cited

U.S. PATENT DOCUMENTS

| | | | |
|---|---|---|---|
| 1,249,530 | 12/1917 | Smith et al. | 324/207 X |
| 2,283,277 | 5/1942 | Modine | 324/207 X |
| 2,428,360 | 10/1947 | Dingley, Jr. | 324/207 X |
| 2,992,325 | 7/1961 | Lehan | 455/304 X |
| 3,412,371 | 11/1968 | Shostak | 340/ |
| 3,868,565 | 2/1975 | Kuipers | 324/207 |
| 3,886,553 | 5/1975 | Bates . | |
| 3,983,474 | 9/1976 | Kuipers | 324/207 |
| 4,247,896 | 1/1981 | Schnaibel | 324/207 X |
| 4,314,251 | 2/1982 | Raab | 324/208 X |
| 4,316,253 | 2/1982 | Posseme . | |
| 4,372,192 | 2/1983 | Lienan | 324/208 X |
| 4,470,013 | 9/1984 | Possémé | 324/207 |

FOREIGN PATENT DOCUMENTS

| | | |
|---|---|---|
| 1058648 | 6/1959 | Fed. Rep. of Germany . |
| 2016937 | 10/1971 | Fed. Rep. of Germany . |
| 2354589 | 1/1978 | France . |
| 2105135 | 3/1983 | United Kingdom . |

OTHER PUBLICATIONS

Raab, "Quasi-Static Magnetic-Field Technique for Determining Position and Orientation", IEEE Trans. on Geoscience and Remote Sensing, vol. GE-19, No. 4, Oct. 1981, pp. 235–243.

Primary Examiner—Reinhard J. Eisenzopf
Assistant Examiner—Warren S. Edmonds
Attorney, Agent, or Firm—Cushman, Darby & Cushman

[57] ABSTRACT

Apparatus for determining the location of a naval vessel includes a magnetic source connected to the vessel for emitting a predetermined magnetic field. Two magnetic detection devices fixed to the seabed detect and measure at least two components of the emitted magnetic field. Location calculation means are coupled to the two magnetic detection devices for calculating the location of the vessel from the components measured by the two magnetic detection devices.

11 Claims, 3 Drawing Sheets

1

SYSTEM FOR CALCULATING THE PATH OF A NAVAL VESSEL

This is a continuation of application Ser. No. 631,750 filed July 17, 1984, which was abandoned upon the filing hereof.

BACKGROUND OF THE INVENTION

The present invention relates to a path calculating system for following the path of a naval vessel with the help of magnetic means. It is particularly usable for tracking a vessel which is immunized against the risks of magnetic detection, particularly in stations which check the magnetic immunization of the vessel.

In a magnetic immunization checking station, measurements are made on a ship or a submarine moving above an aligned array of sensors for, among other things, adjusting the immunization loop currents. For this, the position of the vessel must be located with respect to the sensors for each measurement so as to be able to compare the results of measurements from several passages of the vessel.

The improvements made to magnetic detection systems have led to designing more reliable immunization systems allowing the vessels to escape from a magnetic detection system. Thus, it is necessary to accurately test the immunization of the vessel with high precision, and to be able to locate the current vessel position very accurately during such tests.

Until recently, and in numerous cases still at the present time, the means for locating the were essentially manual; the visual sighting of posts either by an operator or by a video image link. At the present time, the positioning and path calculating systems are radioelectric or optical; they consist in performing a triangulation from a mobile marker or beacon (on the vessel) and two or three fixed markers or beacons disposed on land.

Such an assembly is very large with respect to the size of the measuring base and the corrections to be performed; in fact, the site (normally a port) requires ranges of the order of 4 to 5 kilometers;

The positioning accuracy actually attained is on the order of 2 m in the best of cases. Such an installation is therefore very large. It requires an expensive infrastructure (construction, supply beacon, maintenance, etc.).

The path of a surface craft or a submarine can be obtained acoustically. At least three acoustic sensors or hydrophones are placed and fixed to the sea bed. The vessel whose path is to be calculated is equipped with an acoustic transmitter. Measurement of the times at which the emitted signal is received at the hydrophones allows the position of the craft to be calculated. This technique gives good measuring accuracy but requires a specific acoustic base (3 hydrophones) to be set up.

The present apparatus invention provides for calculating the path of a vessel which apparatus is sufficiently accurate, easy to implement and inexpensive.

SUMMARY OF THE INVENTION

The invention provides a system for calculating the path of a naval vessel. The apparatus includes at least one magnetic source disposed on the vessel and emitting a magnetic field of known characteristics, and detection means external to the vessel for detecting the emitted magnetic field.

BRIEF DESCRIPTION OF THE DRAWINGS

The invention will be better understood and other features and advantages will be clear from the following description with reference to the accompanying Figures in which.

DESCRIPTION OF THE PREFERRED EMBODIMENT

Figure 1:
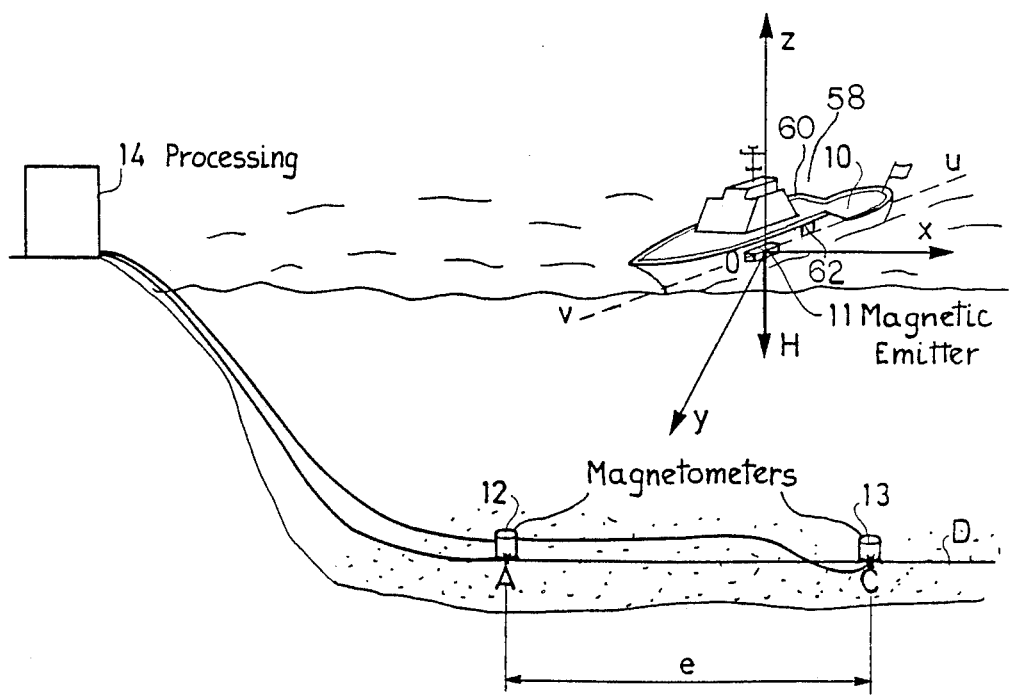
FIG. 1 shows one example of setting up a path calculating system in accordance with the invention.

The path calculating system of FIG. 1 comprises a magnetic radiation emission source 11 fixed to a naval vessel 10, two magnetometers 12 and 13 and a processing installation 14.

The vessel 10 navigates, on the surface, for example, in a given navigation zone contained in a plane xOy.

The magnetometers 12 and 13 may be triaxial directional magnetometers for measuring the magnetic field in three orthogonal directions. Magnetometers 12 and 15 are fixed to the seabed (including riverbeds, oceanbeds or any ground below the water through which the vessel navigates) at points A and C along a straight line D parallel to axis Ox and inside a zone corresponding to the projection, on the bottom of the sea, of the zone of navigation. Magnetometers 12 and 13 are spaced apart by a distance e and are orientated so that their measurement axes are directed parallel to the axes Ox, Oy and Oz. Each magnetometer has then a first measurement axis parallel to Ox, a second measurement axis parallel to Oy and the third measurement axis parallel to Oz, i.e. parallel to the direction of the magnetic field H.

The processing installation 14 may be situated on land. It is connected by data transmission cables to the magnetometers and provides appropriate processing for the data supplied by the magnetometers.

Figure 2A:
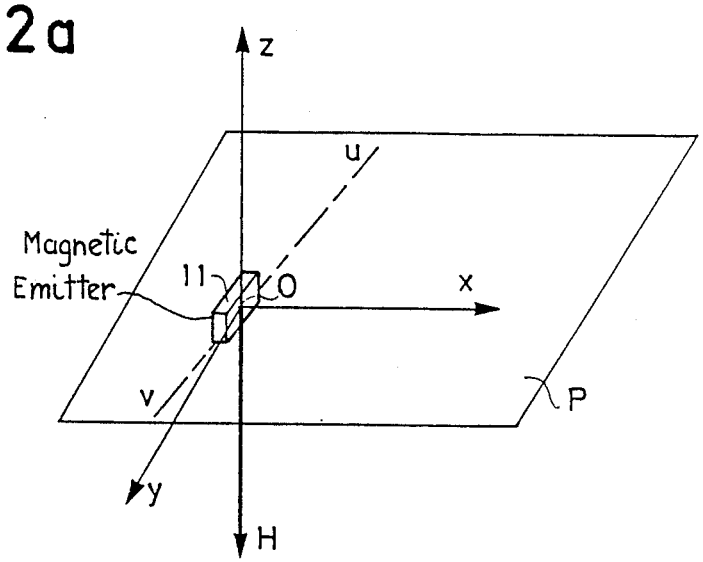
FIGS. 2a and 2b illustrate the magnetic field induction vector diagrams of the system of FIG. 1.
Figure 2B:
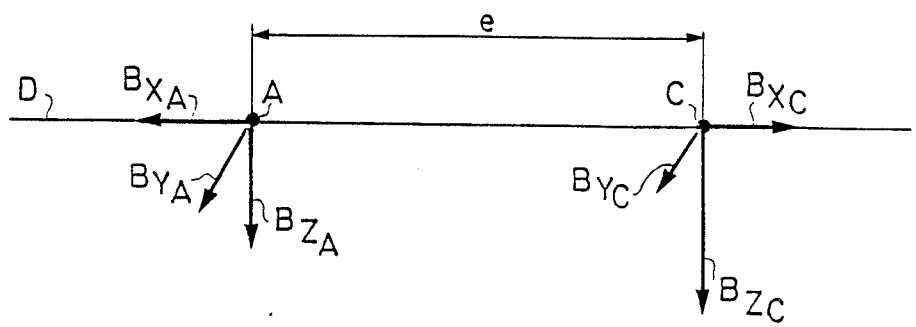

In FIGS. 2a and 2b, illustrating the magnetic induction vector diagrams, we find the magnetic radiation source 11 moving in a direction uv in a plane P, corresponding to the surface of the sea in a case of a surface craft, as well as the trihedron Oxyz.

Points A and C, where the magnetometers are located, are situated on a straight line d parallel to the axis ox.

Source 11 emits a magnetic field H perpendicular to plane P.

The magnetometers 12 and 13 measure, at points A and C respectively, the components of the magnetic field in three directions parallel to the axes Ox, Oy, Oz.

Assuming that the magnetic source 11 emits a dipolar field, the amplitudes of the components of induction B at a point of coordinates X, Y and Z in the trihedron Oxyz are given by:

$$B_X = \frac{3XZ}{d^5} \cdot \frac{\mu_o M}{4\pi}$$

$$B_Y = -\frac{3XZ}{d^5} \cdot \frac{\mu_o M}{4\pi}$$

$$B_Z = \frac{2Z^2 - X^2 - Y^2}{d^5} \cdot \frac{\mu_o M}{4\pi}$$

$$d^2 = X^2 + Y^2 + Z^2$$

where $\mu_o$ = permeability, and

M: magnetic dipolar moment

By applying these relationships to the points A and C of respective coordinates $X_A$, Y, Z and $X_C$, Y, Z and considering that $X_A$ 31 $X_C = e$, we obtain:

$$X_A = e \frac{B_{YC}}{B_{XC}} \cdot \frac{1}{\frac{B_{YC}}{B_{XC}} - \frac{B_{YA}}{B_{XA}}} \quad (1)$$

$$Y = -X_A \cdot \frac{B_{YA}}{B_{XA}}$$

$$X_C = X_A - e$$

The value of Z is known from the immersion depth of the magnetometers.

It should be noted that since the straight line D is parallel to axis Ox, the coordinates Y and Z of points A and C are equal and that only the abscissa $X_A$ and $X_C$ differ.

It is then possible with the system of the invention, by measuring the magnetic fields at two points A and C, to determine the coordinates with respect to a suitably orientated trihedron Oxyz whose apex O is the center of the magnetic radiation emission source 11. Thus, knowing the positions of points A and C it is easy to determine the position of point O, and thus the boat 10.

Moreover, the values of $B_{ZA}$ and of $B_{ZC}$ have not been used which only requires at A and C magnetometers measuring the components of the magnetic fields only along two perpendicular directions Ox and Oy.

Nevertheless, if the magnetometers used also allow the magnetic field components to be measured along the third direction Oz, this facility could be used for carrying out measurements when the vessel passes straight above the straight line D. In that case, coordinate Y becomes very small then O, and components $B_{YA}$ and $B_{YC}$ tend towards O. The equation (1) is indeterminate and can no longer calculate $X_A$. Nevertheless, from the preceding relationships, we obtain the following equation for calculating $X_A$, Z being known:

$$2Z^2 - \frac{3X_A Z B_{ZA}}{B_{XA}} - X_A^2 \left[1 + \left(\frac{B_{YA}}{B_{XA}}\right)^2\right] = 0$$

With this equation moreover, the depth Z at which the magnetometers 12 and 13 are immersed may be calculated. It can then be used when the measures relate to a submerged submarine and in this case Z is the distance which separates the submarine from the seabed on which the magnetometers are located. This technique may also serve for improving the depth measurement as a function of the state of the sea and of the size of the vessel.

Figure 3:
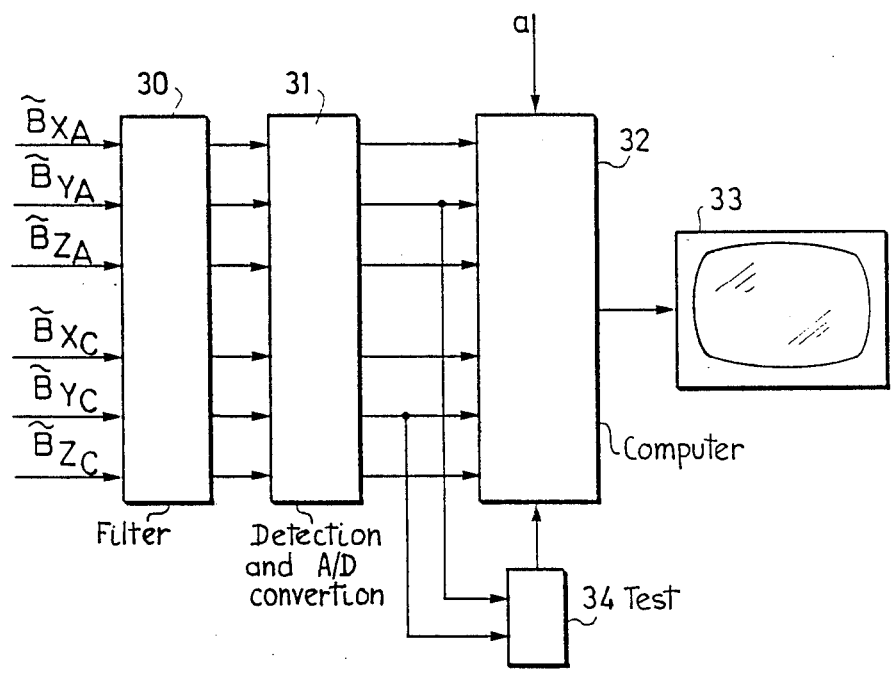
FIG. 3 is an example of the processing installation of the system of the invention.

The measuring station 14 comprises computing means for obtaining $X_A$, Y and possibly Z. FIG. 3 represents a diagram of the processing of the signals received by two triaxial magnetometers.

A filtering circuit 30 receives the magnetic field components at points A and C in the form of electrical signals. These signals are bandpass filtered about the operating frequency of the emission source 11. The signals corresponding to the components at A and C of the magnetic fields emitted by source 11 are fed to a detection device 31 which converts their analog value into a digital value. A computer 32 receives the signals thus processed. In addition computer 32 receives the distance e separating the two magnetometers. Computer 32 computes therefrom the coordinates $X_A$, Y, Z and displays the position of the vessel on a display device 33. A test circuit 34 also detects the zero value of Y for the computer 32.

In practice, with a magnetic moment of $10^3$. $Am^2$ at a frequency of 10 HZ, a vessel may be tracked over a sufficient distance for the operational needs (about 100 meters on each side of the line of sensors). Moreover, for measurement accuracy reasons, the vessel should sail along a line which is transverse and if possible orthogonal to line D and at an equal distance from magnetometers 12 and 13.

So as to avoid the errors diue to poor verticality of the magnetic moment, resulting from the rolling-pitching movements of the vessel, the magnetic source will preferably be suspended.

Figure 4:
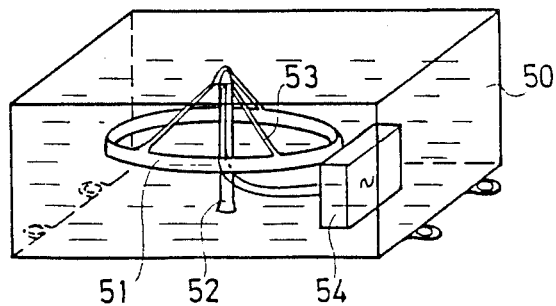
FIG. 4 shows one embodiment of a magnetic source on board a vessel.

In the example shown in FIG. 4, the magnetic source is a coil 51 fed with current and is enclosed in a case 50 riveted to the deck of the vessel or the submarine. Coil 51, whose diameter is equal to about 1 meter for example, is suspended about an axis 52 at its center by means of radial downward sloping connections 53. The case is filled with an electrically insulating oil so as to damp the oscillations of the coil, and it also contains supply circuits 54.

In another embodiment, an immunization adjustments station is provided wherein the magnetic source used is a horizontal immunization loop 60 with which the vessel is already provided. Such immunization loops are known in the art, as evidenced by U.S. Pat. No. 3,110,282 to Foerster. The AC current generated for such an immunization station by a current source 62 for producing the field is chosen at a frequency such that the field produced does not modify the magnetic signature and so does not interfere with the immunization adjustment.

In this case, the craft is equipped with an inclinometer giving the slope angle of the craft which is fed to the land station by radio. Depending on the value of the angle, computer 32 computes the position of the craft by computing the required change of axes.

Finally, the two mangetometers 12 and 13 may be chosen from the magnetometers used in the magnetic immunization checking station for the magnetic measurements. In combination with the preceding variant, the invention presents the advantage, by using existing equipment, of requiring no additional installation.

What is claimed is:

1. Apparatus for determining the location of a naval vessel, comprising:
    magnetic source means adapted to be connected to said vessel, for emitting an alternating magnetic field which has a predetermined orientation with respect to the vessel,;

two magnetometers, adapted to be fixed to a sea bed below the water through which said vessel navigates, for detecting and measuring at least two components of the emitted alternating magnetic field; and location calculation means, coupled to said two magnetometers, for calculating the location of said vessel from the measured components of the emitted alternating magnetic field.

2. Apparatus as claimed in claim 1, wherein said magnetic source means comprises a solenoid fed with and forming a current loop.

3. Apparatus as claimed in claim 2, wherein said solenoid is fed with a current having a predetermined frequency.

4. Apparatus as claimed in claim 3, wherein said solenoid is oriented so as to emit a magnetic flux whose field lines are perpendicular to the plane of navigation of the naval vessel.

5. Apparatus as claimed in claim 4, wherein said solenoid includes suspension means for keeping the solenoid in the same position with respect to a horizontal plane.

6. Apparatus as claimed in claim 5, further comprising means for damping the movements of the solenoid.

7. Apparatus as claimed in claim 1, further including magnetic field immunization loops disposed in said vessel, and wherein said magnetic source comprises at least one of said immunization loops fed with an AC current having a predetermined frequency.

8. Apparatus as claimed in claim 1, wherein said two magnetometers comprise detection means of an immunization adjustment station.

9. Apparatus according to claim 1 wherein said two magnetometers are disposed in a plane which is substantially parallel to a plane of navigation of said vessel.

10. Apparatus according to claim 1 wherein each said magnetometer is oriented to detect and measure said two components of the emitted magnetic field, said two magnetometers means being situated in a plane which is substantially parallel to a plane of navigation of said vessel.

11. Apparatus according to claim 1 wherein each of said magnetometers comprises two directional magnetometers each oriented along an axis lying in a plane which is substantially parallel to a plane of navigation of said vessel, the axis of one of said directional magnetometers being substantially perpendicular to the axis of the other one of said directional magnetometers.

* * * * *